US 8,418,025 B2

(12) United States Patent
Cho et al.

(10) Patent No.: US 8,418,025 B2
(45) Date of Patent: Apr. 9, 2013

(54) METHOD AND APPARATUS FOR TRANSMITTING AND RECEIVING CONTROL INFORMATION IN A WIRELESS COMMUNICATION SYSTEM

(75) Inventors: Hee Jeong Cho, Gyeonggi-do (KR); Ki Seon Ryu, Gyeonggi-do (KR); Su Nam Kim, Gyeonggi-do (KR); Eun Jong Lee, Gyeonggi-do (KR); Yong Ho Kim, Gyeonggi-do (KR); Young Soo Yuk, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 466 days.

(21) Appl. No.: 12/751,166

(22) Filed: Mar. 31, 2010

(65) Prior Publication Data

US 2010/0251083 A1    Sep. 30, 2010

Related U.S. Application Data

(60) Provisional application No. 61/165,436, filed on Mar. 31, 2009, provisional application No. 61/166,783, filed on Apr. 6, 2009, provisional application No. 61/168,620, filed on Apr. 13, 2009, provisional application No. 61/239,015, filed on Sep. 1, 2009.

(30) Foreign Application Priority Data

Jul. 20, 2009   (KR) .................. 10-2009-0065819
Jan. 4, 2010    (KR) .................. 10-2010-0000128
Feb. 4, 2010    (KR) .................. 10-2010-0010414

(51) Int. Cl.
    *H03M 13/00*      (2006.01)
(52) U.S. Cl.
    USPC ........................................ 714/758; 714/4.1

(58) Field of Classification Search .................. 714/758, 714/4.1
See application file for complete search history.

(56) References Cited

U.S. PATENT DOCUMENTS

2006/0114909 A1    6/2006   Uzrad-Nali et al.
2007/0061673 A1    3/2007   Pan et al.
(Continued)

FOREIGN PATENT DOCUMENTS

EP    1494372    1/2005
RU    2267222    12/2005
(Continued)

OTHER PUBLICATIONS

Samsung Electronics, "Proposed change to RAID and CDMA allocation A-MAP IE (16.2.11.2)", IEEE 802.16 Broadband Wireless Access Working Group, IEEE C80216m-09_2988, Dec. 2009, XP-017613483.

LG Electronics et al., "Design of the CDMA Allocation A-MAP IE for Bandwidth Request Procedure", IEEE C802.16m-09/1067, Apr. 2009, XP-017617092.

(Continued)

*Primary Examiner* — Charles Ehne
(74) *Attorney, Agent, or Firm* — Lee, Hong, Degerman, Kang & Waimey

(57) ABSTRACT

A method and apparatus for transmitting and receiving control information in a wireless communication system are disclosed. The control information transmission method includes masking a Cyclic Redundancy Check (CRC) by a CRC mask including a bit stream of a predetermined length and an indicator indicating the bit stream, and transmitting control information including the masked CRC to at least one Mobile Station (MS). The indicator indicates whether the bit stream included in the CRC mask includes a Random Access IDentifier (RAID).

18 Claims, 8 Drawing Sheets

U.S. PATENT DOCUMENTS

| | | | |
|---|---|---|---|
| 2008/0273610 A1 | 11/2008 | Malladi et al. | |
| 2009/0186613 A1* | 7/2009 | Ahn et al. | 455/434 |
| 2009/0238128 A1* | 9/2009 | Park et al. | 370/329 |
| 2010/0296473 A1* | 11/2010 | Kim et al. | 370/329 |

FOREIGN PATENT DOCUMENTS

| | | |
|---|---|---|
| RU | 2348116 | 2/2009 |
| WO | 00/28763 | 5/2000 |
| WO | 2008/024788 | 2/2008 |

OTHER PUBLICATIONS

Nokia Siemens Networks et al., "CRC Mask Selection for PBCH", R1-081073, 3GPP TSG RAN WG1 #52 Meeting, Feb. 2008, XP-050109524.

InterDigital, "Updated recommendation for UE-specific CRC", R1-01-1066, TSG-RAN Working Group 1 Ad Hoc, Nov. 2001, XP-002345604.

* cited by examiner (a)

(b)

(a)

(b)

(a)

(b)

(a)

(b)

(a)

(b)

(a)

(b)

METHOD AND APPARATUS FOR TRANSMITTING AND RECEIVING CONTROL INFORMATION IN A WIRELESS COMMUNICATION SYSTEM

CROSS REFERENCE TO RELATED APPLICATIONS

This application claims the benefit of U.S. Provisional Application Ser. Nos. 61/165,436, filed on Mar. 31, 2009, 61/166,783, filed on Apr. 6, 2009, 61/168,620, filed on Apr. 13, 2009, and 61/239,015, filed on Sep. 1, 2009, and also claims the benefit of earlier filing date and right of priority to Korean Patent Application Nos. 10-2009-0065819, filed on Jul. 20, 2009, 10-2010-0000128, filed on Jan. 4, 2010, and 10-2010-0010414, filed on Feb. 4, 2010, the contents of all of which are incorporated by reference herein in their entireties.

BACKGROUND OF THE INVENTION

1. Field of the Invention

The present invention relates to a wireless communication system, and more particularly, to a method and apparatus for transmitting and receiving control information in a wireless communication system.

2. Discussion of the Related Art

A description will first be made of a conventional method for transmitting control information in a wireless communication system. In an Institute of Electrical and Electronics Engineers (IEEE) 802.16e system, a Base Station (BS) allocates resources to a Mobile Station (MS) that has requested a bandwidth by a ranging code, using a Code Division Multiple Access (CDMA) allocation Information Element (IE).

Ranging codes are classified into four subsets according to the purposes that they serve, specifically initial ranging, handover ranging, periodic ranging, and bandwidth request. Conventionally, a plurality of ranging codes are generated and classified into four subsets according to their purposes. Thus the ranging codes have different indexes.

[Table 1] below illustrates a CDMA allocation IE.

| Syntax | Size (bit) | Notes |
|---|---|---|
| CDMA_Allocation_IE( ) { | — | — |
|   Duration | 6 | — |
|   UIUC | 4 | UIUC for transmission |
|   Repetition Coding Indication | 2 | 0b00: No repetition coding<br>0b01: Repetition coding of 2 used<br>0b10: Repetition coding of 4 used<br>0b11: Repetition coding of 6 used |
|   Frame Number Index | 4 | LSBs of relevant frame number |
|   Ranging Code | 8 | — |
|   Ranging Symbol | 8 | — |
|   Ranging subchannel | 7 | — |
|   BW request mandatory | 1 | 1: Yes<br>0: No |
| } | — | — |

In [Table 1], Duration indicates the amount of resources that a BS allocates to an MS by the CDMA allocation IE, in Orthogonal Frequency Division Multiple Access (OFDMA) symbols. Repetition Coding Indication specifies a coding rate of data that the MS is supposed to transmit in the allocated resources.

Frame Number Index identifies a frame in which the UE transmitted a CDMA code by four Least Significant Bits (LSBs) of a frame number.

Ranging Code specifies the CDMA code transmitted by the UE and Ranging Symbol indicates an OFMA symbol carrying the CDMA code transmitted by the UE. Ranging Subchannel indicates a ranging subchannel in which the MS transmitted the CDMA code.

In an IEEE 802.16m system which is recently under standardization, an Advanced BS (ABS) transmits unicast service control information to an Advanced MS (AMS) by an Advanced MAP (A-MAP). The unicast service control information includes user-specific control information and non-user-specific control information. The user-specific control information is further divided into resource assignment information, Hybrid Automatic Repeat reQuest (HARQ) feedback information, and power control information. The resource assignment information, the HARQ feedback information, and the power control information are transmitted respectively in an assignment A-MAP, an HARQ A-MAP, and a power control A-MAP. All A-MAPs share a region of physical resources, called A-MAP region.

Each A-MAP IE includes a 16-bit Cyclic Redundancy Check (CRC).

With reference to FIG. 1, how an ABS appends a CRC to an A-MAP IE will be described below.

FIG. 1(a) illustrates an ABS's operation for masking a CRC by a Station ID (STID) and FIG. 1(b) illustrates an ABS's operation for masking a CRC by a Random Access ID (RAID). The term "STID" covers both an ID allocated to a particular AMS and an ID allocated commonly to a plurality of AMSs, in its meaning.

Referring to FIGS. 1(a) and 1(b), the ABS generates a CRC using a cyclic generator polynomial, masks the CRC by a 12-bit STID or a 12-bit RAID, and appends the resulting Masked CRC (MCRC) to input data. Specifically, the ABS appends a CRC masked with an STID of an identified AMS (i.e. an MCRC) to an A-MAP IE destined for the AMS, whereas it appends a CRC masked with a RAID (i.e. an MCRC) to an A-MAP IE destined for an anonymous UE. A RAID is generated according to random access attributes which are the indexes of time and frequency in which an AMS transmitted a code, and the index of the code.

FIG. 2(a) illustrates an AMS's operation for masking a received MCRC by an STID and FIG. 2(b) illustrates an AMS's operation for masking a received MCRC by an RAID.

Referring to FIGS. 2(a) and 2(b), upon receipt of an A-MAP IE, the AMS decodes the A-MAP IE and calculates a 16-bit MCRC of the A-MAP IE using a cyclic generator polynomial. The AMS then masks the 16-bit MCRC by its STID. Specifically, if the result of masking the MCRS with the STID is zero, the AMS determines that the ABS transmitted the A-MAP IE for the AMS and reads the remaining fields of the A-MAP IE.

In the case where the AMS has attempted a random access and is awaiting reception of a response to the random access attempt, if the result of masking the MCRS with the STID is non-zero, the AMS masks the MCRC with an RAID. If the result of masking the MCRC with the RAID is zero, the AMS determines that the ABS transmitted the A-MAP IE for the AMS and reads the remaining fields of the A-MAP IE.

When the AMS has not attempted a random access and the result of masking the MCRC by the STID is non-zero, or when the AMS has attempted a random access and the result of masking the MCRC by the RAID is non-zero, the AMS ignores the A-MAP IE.

According to the conventional technology, however, when the STID of an AMS is identical to the RAID of another AMS or when the RAID of an AMS that has transmitted a ranging code is identical to the RAID of an AMS that has transmitted a bandwidth request code, the AMS may recognize that an A-MAP IE destined for another AMS is for its own.

The same problem may be encountered when an A-MAP IE has a decoding error, in spite of different IDs for AMSs. For example, although an ABS transmits to AMS A an A-MAP IE including a CRC (i.e. MCRC) masked by the STID of AMS A, AMS B may mistake the A-MAP IE for an A-MAP IE including a CRC (i.e. MCRC) masked by its RAID due to wrong decoding.

In the IEEE 802.16e system, different indexes are assigned to all codes because codes designed in the same manner are classified into four subsets according to their purposes. Compared to the IEEE 802.16e system, bandwidth request codes and ranging codes are separately designed in the IEEE 802.16m system. As a consequence, some bandwidth request codes may have the same indexes as ranging codes. In addition, an ABS that has received a bandwidth request code and an ABS that has received a ranging code transmit uplink allocation information to AMSs in the same type of A-MAP IEs.

Another cause of the above problem is that the same CRC is masked with different IDs under circumstances.

SUMMARY OF THE INVENTION

As described above, if the STID of an AMS is identical to the RAID of another AMS or if the RAID of an AMS that has transmitted a ranging code is identical to the RAID of another AMS that has transmitted a bandwidth request code, the AMS may misjudge that an A-MAP IE destined for another AMS is for its own. Moreover, although AMSs have different IDs, it may occur that an AMS mistakes an A-MAP IE destined for another AMS for its own.

Accordingly, the present invention is directed to a method and apparatus for transmitting and receiving control information in a wireless communication system that substantially obviate one or more problems due to limitations and disadvantages of the related art.

An object of the present invention is to provide a method for transmitting control information in such a manner that a Mobile Station (an MS) does not mistake an Advanced-MAP Information Element (IE) destined for another MS for its own.

Another object of the present invention is to provide a CRC masking method for transmitting control information, so that an MS can efficiently receive the control information.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for transmitting control information at a BS in a wireless communication system includes masking a Cyclic Redundancy Check (CRC) by a CRC mask including a bit stream of a predetermined length and an indicator indicating the bit stream, and transmitting control information including the masked CRC to at least one MS. The indicator indicates whether the bit stream included in the CRC mask includes a Random Access IDentifier (RAID).

If the bit stream does not include the RAID, the bit stream may include a Station ID (STID). The STID may identify one MS or a plurality of MSs.

The bit stream may further include one or more additional bits. The one or more additional bits may indicate whether the STID identifies one MS or a plurality of MSs.

The method may be implemented when the BS receives a ranging code from the at least one MS. The bit stream may include the RAID and the control information may allocate resources that the at least one MS requests by the ranging code. The RAID may be a RAID for ranging and generated according to indexes of time and frequency in which the ranging code is transmitted and an index of the ranging code.

The method may be implemented when the BS receives a bandwidth request code from the at least one MS. The bit stream may include the RAID and the control information may allocate resources that the at least one MS requests by the bandwidth request code. The RAID may be a RAID for bandwidth request and generated according to indexes of time and frequency in which the bandwidth request code is transmitted and an index of the bandwidth request code.

In another aspect of the present invention, a method for receiving control information at an MS in a wireless communication system includes receiving from a BS control information including a CRC masked by a CRC mask including a bit stream of a predetermined length and an indicator indicating the bit stream, and decoding the control information and checking the masked CRC. The indicator indicates whether the bit stream included in the CRC mask includes a RAID.

In another aspect of the present invention, a BS for transmitting control information in a wireless communication system includes a processor, a reception module, a transmission module, and an antenna for transmitting a radio signal received over the air to the reception module and transmitting a radio signal received from the transmission module over the air. The processor controls a CRC to be masked by a CRC mask including a bit stream of a predetermined length and an indicator identifying the bit stream and controls control information including the masked CRC to be transmitted to at least one MS through the transmission module. The indicator indicates whether the bit stream included in the CRC mask includes a RAID.

In another aspect of the present invention, an MS for receiving control information in a wireless communication system includes a processor, a reception module, a transmission module, and an antenna for transmitting a radio signal received over the air to the reception module and transmitting a radio signal received from the transmission module over the air. The processor controls control information including a CRC masked by a CRC mask including a bit stream of a predetermined length and an indicator indicating the bit stream to be received from a BS and to be decoded and controls the masked CRC to be checked. The indicator indicates whether the bit stream included in the CRC mask includes a RAID.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
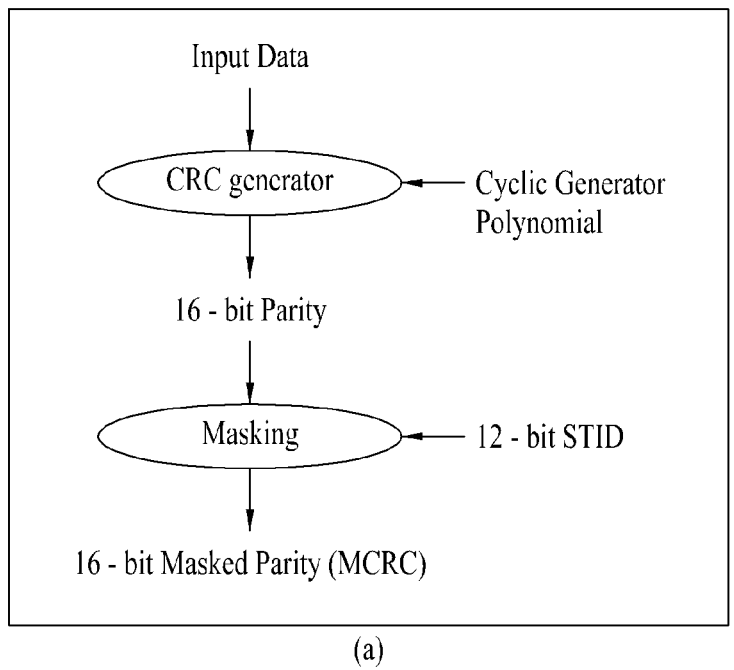
FIG. 1(a) illustrates an Advanced Base Station (ABS)'s operation for masking a Cyclic Redundancy Check (CRC) by a Station IDentifier (STID).
FIG. 1(b) illustrates an ABS's operation for masking a CRC by a Random Access ID (RAID).
Figure 1:
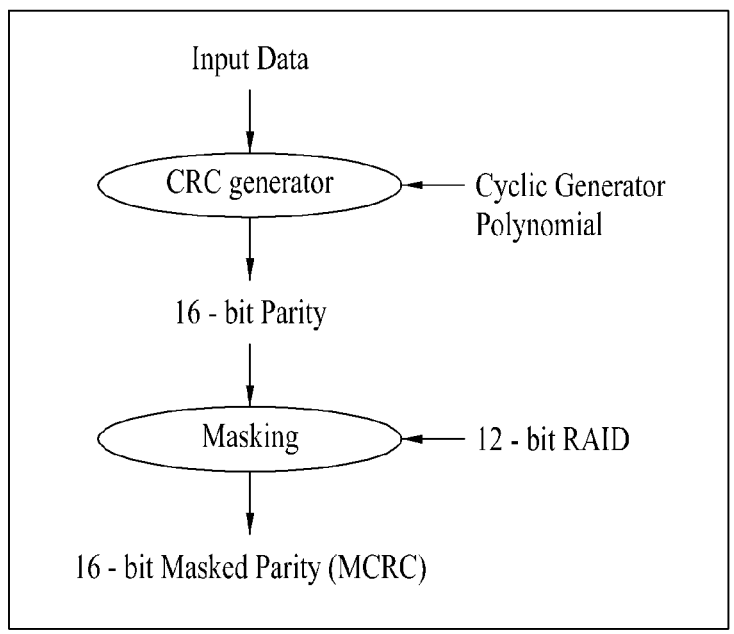
Figure 2:
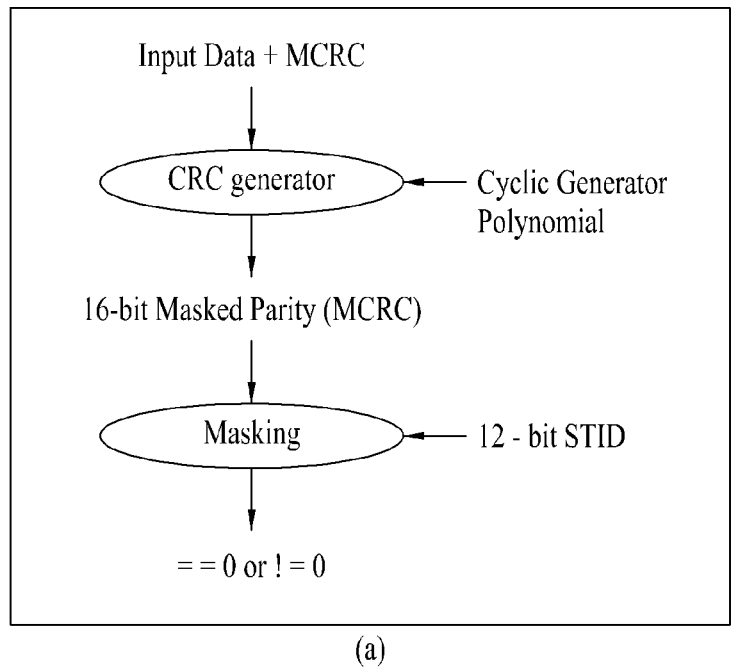
FIG. 2(a) illustrates an Advanced Mobile Station (AMS)'s operation for masking a received Masked CRC (MCRC) by an STID.
FIG. 2(b) illustrates an AMS's operation for masking a received MCRC by an RAID.
Figure 2:
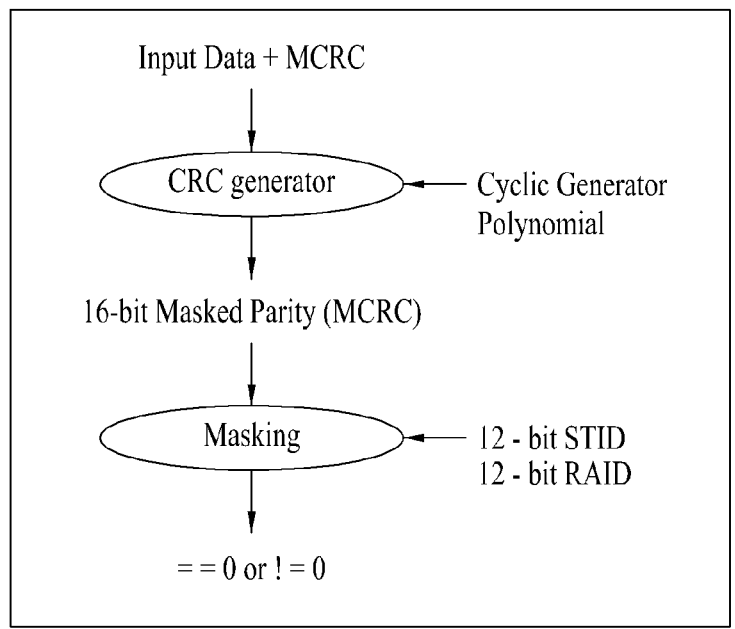

Now, the above and other aspects of the present invention will be described in detail through preferred embodiments with reference to the accompanying drawings so that the present invention can be easily understood and realized by those skilled in the art. Modifications to the preferred embodiment will be readily apparent to those of ordinary skill in the art, and the disclosure set forth herein may be applied to other embodiments and applications without departing from the spirit and scope of the present invention and the appended claims. In the following description of the present invention, a detailed description of known functions and configurations incorporated herein will be omitted when it may obscure the subject matter of the present invention. The same reference numbers will be used throughout this specification to refer to the same or like parts.

Through the specification, when it is said that some part "includes" a specific element, this means that the part may further include other elements, not excluding them, unless otherwise mentioned. The term "-er(or)", "module", "portion" or "part" is used to signify a unit of performing at least one function or operation. The unit can be realized in hardware, software, or in combination of both.

The term 'Base Station (BS)' may be replaced with the term 'Advanced BS (ABS)', 'fixed station', 'Node B', 'eNode B (eNB)', 'access point', etc. The term 'Mobile Station (MS)' may be replaced with the term 'Advanced MS (AMS)', 'User Equipment (UE)', 'Subscriber Station (SS)', 'Mobile Subscriber Station (MSS)', 'mobile terminal', 'terminal', etc.

Methods for transmitting control information according to exemplary embodiments of the present invention will be described below with reference to FIGS. 3 to 6.

In the exemplary embodiments of the present invention, a Cyclic Redundancy Check (CRC) appended to control information is masked by a Station IDentifier (STID) and a masking indicator, or a Random Access ID (RAID) and a masking indicator. The following description is made with the appreciation that the term "STID" covers, in its sense, an ID allocated to a particular AMS and an ID allocated commonly to a plurality of AMSs.

A masking indicator will first be described. A wireless communication system according to an exemplary embodiment of the present invention uses a 16-bit CRC, a 12-bit STID, and a 12-bit RAID. Hence, up to 4 bits are available to a masking indicator. [Table 2] below illustrates definition of a masking indicator according to an exemplary embodiment of the present invention.

TABLE 2

| Masking indicator | Description |
| --- | --- |
| 0b0000 | CRC is masked by 12-bit STID |
| 0b0001 | CRC is masked by 12-bit RAID for raging |
| 0b0010 | CRC is masked by 12-bit RAID for bandwidth request |
| 0b0011 | CRC is masked by 16-bit STID |
| 0b0100 to 0b1111 | Reserved |

The masking indicator indicates an ID used for CRC masking. Referring to [Table 1], the masking indicator indicates whether a CRC is masked by a 12-bit STID, an RAID for ranging, an RAID for bandwidth request, or a 16-bit STID.

A RAID is generated according to random access attributes such as the indexes of time and frequency in which an AMS transmitted a code and the index of the code. A distinction is made between a RAID for ranging and a RAID for bandwidth request depending on whether an AMS transmitted a ranging code or a bandwidth request code to an ABS. Specifically, when the AMS transmitted a ranging code to the ABS, a RAID generated by the ABS is a RAID for ranging, whereas when the AMS transmitted a bandwidth request code to the ABS, a RAID generated by the ABS is a RAID for bandwidth request.

If the ABS allocates a 16-bit STID to an AMS, the 16-bit STID may include a masking indicator of 0011 at a position set for the masking indicator. For example, if the masking indicator is supposed to be positioned in Most Significant Bits (MSBs) of the 16-bit STID, the 16-bit STID takes the form of 0b0011xxxxxxxxxxxx. Therefore, the value of 0011 serves at once as a masking indicator and part of the STID.

The masking indicator may be inserted at MSBs, LSBs or any other positions among 16 bits by which a CRC is masked.

If four masking indicators are defined as illustrated in [Table 1], 2 bits are sufficient to represent the four masking indicators. The remaining 2 bits of four bits for the masking indicators may be used for another field.

Figure 3:
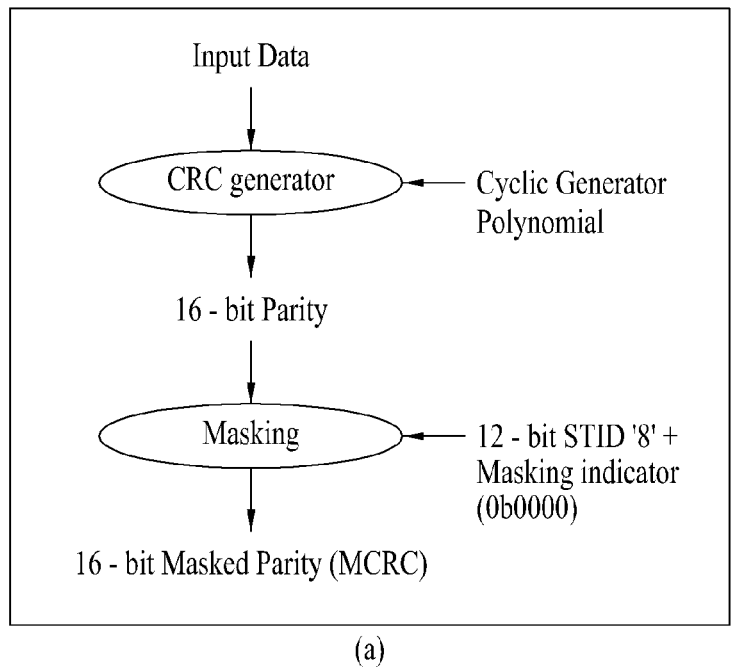
FIG. 3(a) illustrates a method for transmitting control information, when an ABS masks a CRC by an STID and a masking indicator according to an exemplary embodiment of the present invention.
FIG. 3(b) illustrates a method for receiving control information that includes a CRC masked by an STID and a masking indicator according to an exemplary embodiment of the present invention.
Figure 3:
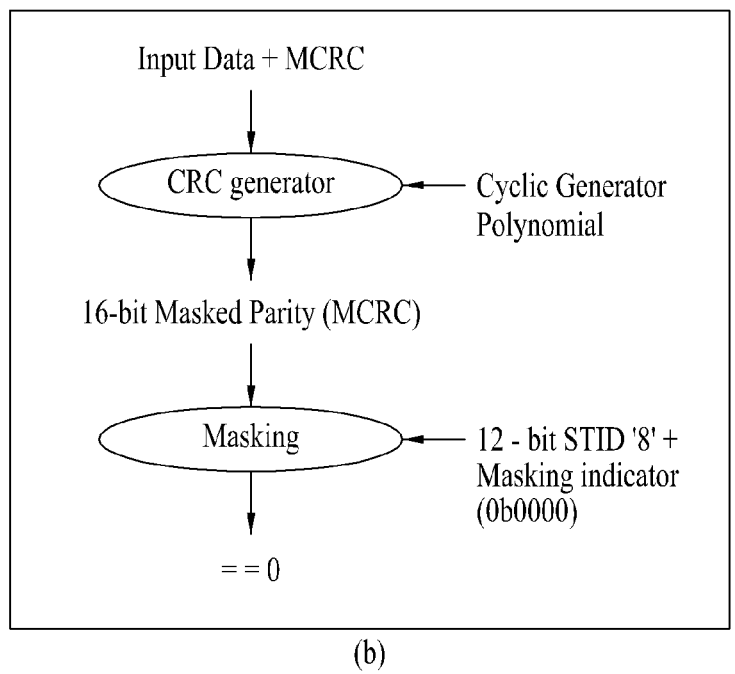

With reference to FIG. 3, a description will first be made of a method for transmitting control information in the case where a CRC is masked by a 12-bit STID and a masking indicator according to an exemplary embodiment of the present invention.

FIG. 3(a) illustrates a method for transmitting control information when an ABS masks a CRC by an STID and an masking indicator according to an exemplary embodiment of the present invention, and FIG. 3(b) illustrates a method for receiving control information including a CRC masked by an STID and a masking indicator according to an exemplary embodiment of the present invention.

Referring to FIG. 3(a), the ABS generates a CRC using a cyclic generator polynomial and masks the CRC by a 12-bit STID and a masking indicator of 0b0000. Then the ABS transmits control information including the masked 16-bit CRC (16-bit MCRC) to an AMS. The control information may be an A-MAP IE. While the exemplary embodiment of the present invention has been described in the context that control information is an A-MAP IE, it should not be construed as limiting the present invention.

Referring to FIG. 3(b), upon receipt of the A-MAP IE from the ABS, an AMS decodes the A-MAP IE and calculates a 16-bit MCRC using a cyclic generator polynomial. If the AMS did not perform a random access procedure, it masks the 16-bit MCRC with an STID and the masking indicator of 0b000.

During a random access, an AMS transmits a ranging code or a bandwidth request code to an ABS. The ABS transmits to the AMS an A-MAP IE including a CRC masked by an RAID for ranging and a masking indicator of 0b0001 or a CRC masked by an RAID for bandwidth request and a masking indicator of 0b0010. Meanwhile, for an AMS that did not transmit a ranging code or a bandwidth request code to an ABS, the ABS masks a CRC by an STID and the masking indicator of 0b0000 and appends the MCRC to an A-MAP IE.

Therefore, the AMS that did not perform a random access procedure masks the 16-bit MCRC with the STID and the masking indicator of 0b0000.

If the result of masking the MCRC with the STID and the masking indicator of 0b0000 is zero, the AMS reads the remaining fields of the A-MAP IE, determining that the A-MAP IE is for the AMS. On the contrary, if the result of masking the MCRC with the STID and the masking indicator of 0b0000 is non-zero, the AMS ignores the A-MAP IE.

Figure 4:
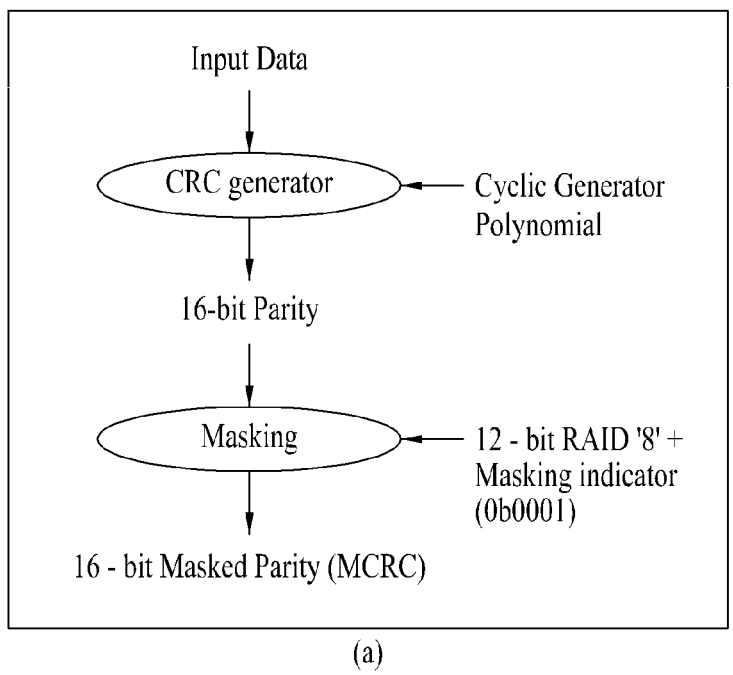
FIG. 4(a) illustrates a method for transmitting control information, when an ABS masks a CRC by a RAID for ranging and a masking indicator according to an exemplary embodiment of the present invention.
FIG. 4(b) illustrates a method for receiving control information that includes a CRC masked by a RAID for ranging and a masking indicator according to an exemplary embodiment of the present invention.
Figure 4:
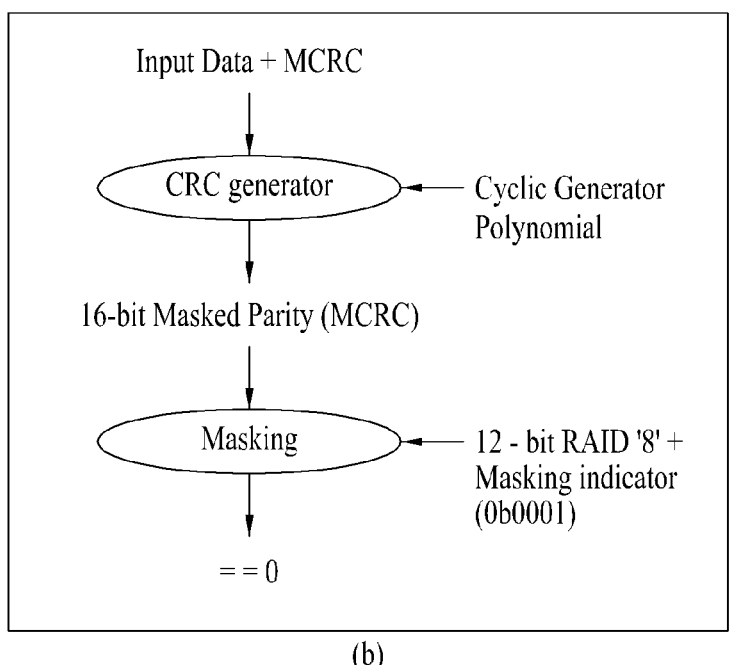

With reference to FIG. 4, a description will be made of a method for transmitting control information in the case where a CRC is masked by a RAID for ranging and a masking indicator according to an exemplary embodiment of the present invention.

FIG. 4(a) illustrates a method for transmitting control information when an ABS masks a CRC with a RAID for ranging and an masking indicator according to an exemplary embodiment of the present invention, and FIG. 4(b) illustrates a method for receiving control information including a CRC masked by a RAID for ranging and a masking indicator according to an exemplary embodiment of the present invention.

Upon receipt of a ranging code from an AMS, the ABS allocates resources that the AMS has requested by the ranging code to the AMS by a CDMA allocation A-MAP IE. The ABS includes a CRC masked by a RAID for ranging and the masking indicator of 0b0001 to the CDMA allocation A-MAP IE, prior to transmission to the AMS.

Referring to FIG. 4(a), the ABS generates a CRC using a cyclic generator polynomial and masks the CRC by a RAID for ranging and the masking indicator of 0b0001. Then the ABS transmits a CDMA allocation A-MAP IE including the 16-bit MCRC to an AMS.

Referring to FIG. 4(b), if the AMS transmitted a ranging code for initial access to the ABS, the AMS decodes the CDMA allocation A-MAP IE and calculates a 16-bit MCRC using a cyclic generator polynomial. The AMS masks the 16-bit MCRC with a RAID for ranging and the masking indicator of 0b0001.

If the result of masking the MCRC with the RAID for ranging and the masking indicator of 0b0001 is zero, the AMS reads the remaining fields of the CDMA allocation A-MAP IE, determining that the CDMA allocation A-MAP IE is for the AMS. On the other hand, if the result of masking the MCRC with the RAID for ranging and the masking indicator of 0b0001 is non-zero, the AMS ignores the CDMA allocation A-MAP IE.

An STID has not been allocated yet to the AMS that transmitted the ranging code for initial access. Therefore, the AMS does not mask the CDMA allocation A-MAP IE by an STID.

In the case where the AMS transmitted a handover ranging code to the ABS, the AMS decodes the CDMA allocation A-MAP IE and calculates a 16-bit MCRC using a cyclic generator polynomial, as illustrated in FIG. 4(b). Depending on whether a Target ABS (TABS) has allocated a dedicated handover ranging code and an STID to the AMS, the AMS performs a different procedure. If the dedicated handover ranging code and the STID have not been allocated to the AMS, the AMS operates in the same manner as for the aforedescribed initial access. On the other hand, if both the dedicated handover ranging code and the STID have been allocated to the AMS, the AMS is not aware whether the received A-MAP IE is a response to the transmitted ranging code or a general A-MAP IE.

Thus the AMS masks the MCRC with the STID and the masking indicator of 0b0000. If the masking result is zero, the AMS reads the remaining fields of the A-MAP IE, determining that the A-MAP IE is for the AMS.

On the contrary, if the masking result is non-zero, the AMS masks the MCRC with the RAID for ranging and the masking indicator of 0b0001. If the masking result is zero, the AMS reads the remaining fields of the CDMA allocation A-MAP IE, determining that the CDMA allocation A-MAP IE is for the AMS. On the contrary, if the masking result is non-zero, the AMS ignores the CDMA allocation A-MAP IE.

When it is preliminarily defined that the ABS transmits to an AMS a general A-MAP IE including a CRC masked by an STID of the AMS instead of a RAID as a response to a ranging code transmitted by the AMS to which a dedicated handover ranging code and the STID were allocated, the AMS has only to determine using its STID whether the A-MAP IE is for the AMS. For example, the A-MAP IE may be a DownLink (DL) basic assignment A-MAP IE for downlink resource allocation or an UpLink (UL) basic assignment A-MAP IE for uplink resource allocation.

Figure 5:
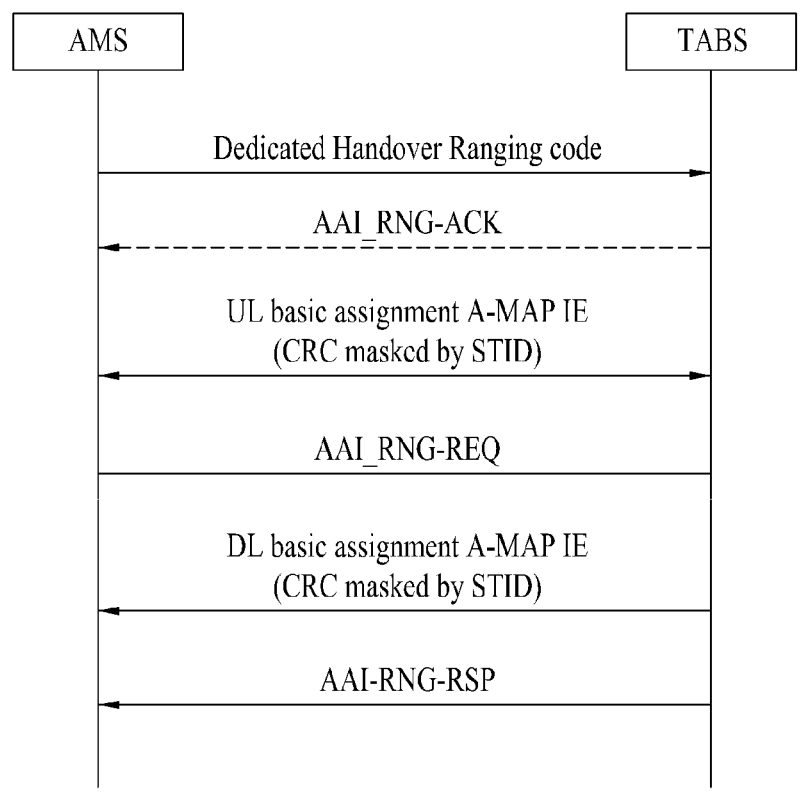
FIG. 5 is a diagram illustrating a signal flow for allocating resources to an AMS that transmitted a dedicated handover ranging code by a general Advanced-MAP (A-MAP) Information Element (IE) including a CRC masked by an STID allocated to the AMS, upon receipt of the dedicated handover ranging code, in an ABS.

FIG. 5 is a diagram illustrating a signal flow for allocating resources to an AMS by a general A-MAP IE including a CRC masked by an STID allocated to the AMS, when an ABS receives a dedicated handover ranging code from the AMS.

In FIG. 5, an ABS is expressed as "TABS" meaning a target ABS.

Referring to FIG. 5, upon receipt of a dedicated handover ranging code from an AMS, the TABS may transmit a UL basic assignment A-MAP IE including a CRC masked by an STID allocated to the AMS, so that the AMS can transmit an Advanced Air Interface Ranging Request (AAI-RNG-REQ) message. In addition, the TABS may transmit to the AMS a Ranging Acknowledgment (RNG-ACK) message indicating that the TABS has received the dedicated handover ranging code successfully. Upon receipt of the UL basic assignment A-MAP IE from the TABS, the AMS may transmit an AAI-RNG-REQ message in UL resources allocated by the UL basic assignment A-MAP IE. Upon receipt of the AAI-RNG-REQ message, the TABS may transmit a DL basic assignment A-MAP IE including a CRC masked by the STID of the AMS in order to indicate a DL resource area carrying an Advanced Air Interface Ranging Response (AAI-RNG-RSP) message. Then the TABS may transmit the AAI-RNG-RSP message in the DL resources allocated by the DL basic assignment A-MAP IE.

In this exemplary embodiment of the present invention, the A-MAP IE transmitted by the TABS may include a CRC masked according to various exemplary embodiments of the present invention.

Figure 6:
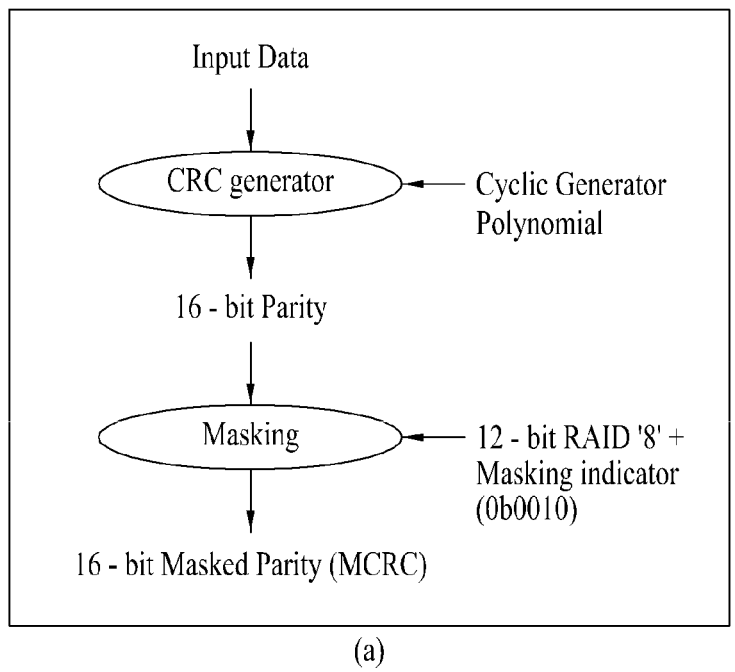
FIG. 6(a) illustrates a method for transmitting control information, when an ABS masks a CRC by a RAID for bandwidth request and a masking indicator according to an exemplary embodiment of the present invention.
FIG. 6(b) illustrates a method for receiving control information that includes a CRC masked by a RAID for bandwidth request and a masking indicator according to an exemplary embodiment of the present invention.
Figure 6:
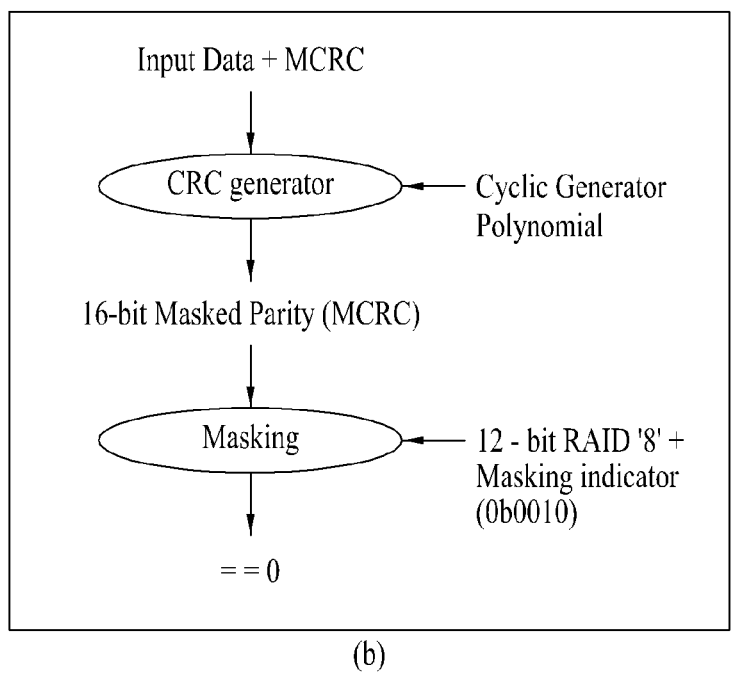

With reference to FIG. 6, a description will be made of a method for transmitting control information in the case where a CRC is masked by a RAID for bandwidth request and a masking indicator according to an exemplary embodiment of the present invention.

FIG. 6(a) illustrates a method for transmitting control information when an ABS masks a CRC by a RAID for bandwidth request and a masking indicator according to an exemplary embodiment of the present invention, and FIG. 6(b) illustrates a method for receiving control information including a CRC masked by a RAID for bandwidth request and a masking indicator according to an exemplary embodiment of the present invention.

Upon receipt of a bandwidth request code from an AMS, the ABS allocates resources that the AMS has requested by the bandwidth request code to the AMS by a CDMA allocation A-MAP IE. The ABS includes a CRC masked by a RAID for bandwidth request and the masking indicator of 0b0010 in the CDMA allocation A-MAP IE, for transmission to the AMS.

Referring to FIG. 6(a), the ABS generates a CRC using a cyclic generator polynomial and masks the CRC by a RAID for bandwidth request and the masking indicator of 0b0010. Then the ABS transmits a CDMA allocation A-MAP IE including the 16-bit MCRC to an AMS.

Referring to FIG. 6(b), upon receipt of the CDMA allocation A-MAP IE, an AMS decodes the CDMA allocation A-MAP IE and calculates a 16-bit MCRC using a cyclic generator polynomial. Without knowing whether the received A-MAP IE is a response to a transmitted bandwidth request code or a general A-MAP IE, the AMS first masks the 16-bit MCRC with an STID and the masking indicator of 0b0000. If the result of masking the MCRC with the STID and the masking indicator of 0b0000 is zero, the AMS reads the remaining fields of the A-MAP IE, determining that the A-MAP IE is for the AMS. On the other hand, if the result of masking the MCRC with the STID and the masking indicator of 0b0000 is non-zero, the AMS masks the MCRC with a RAID for bandwidth request and the masking indicator of 0b0010.

If the result of masking the MCRC with the RAID for bandwidth request and the masking indicator of 0b0010 is zero, the AMS reads the remaining fields of the CDMA allocation A-MAP IE, determining that the CDMA allocation A-MAP IE is for the AMS. On the other hand, if the result of masking the MCRC with the RAID for bandwidth request and the masking indicator of 0b0010 is non-zero, the AMS ignores the CDMA allocation A-MAP IE.

Figure 7:
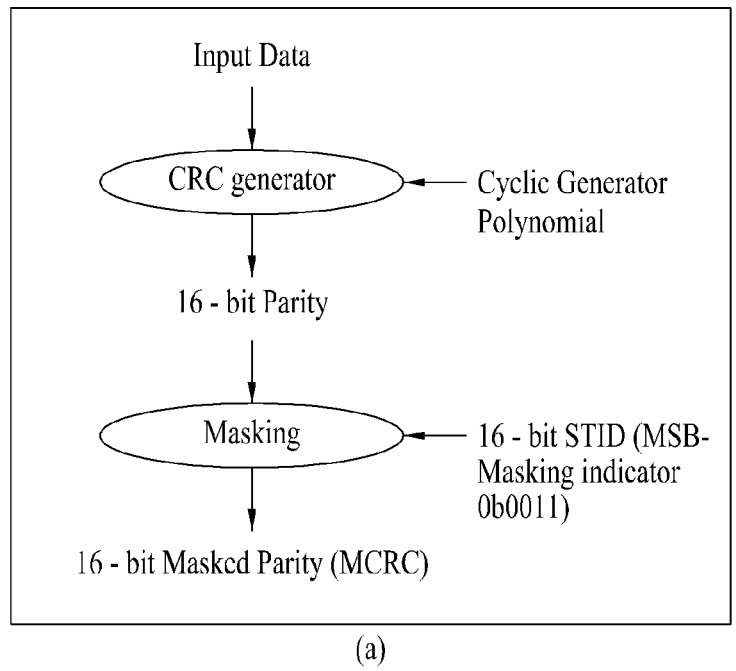
FIG. 7(a) illustrates a method for transmitting control information, when an ABS masks a CRC by a 16-bit STID according to an exemplary embodiment of the present invention.
FIG. 7(b) illustrates a method for receiving control information that includes a CRC masked by a 16-bit STID according to an exemplary embodiment of the present invention.
Figure 7:
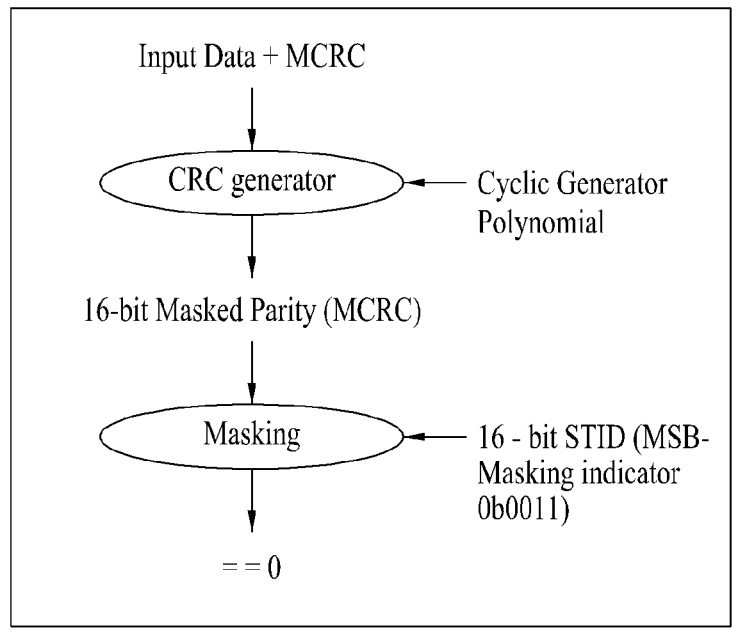

With reference to FIG. 7, a description will be made of a method for transmitting control information in the case where a CRC is masked by a 16-bit STID according to an exemplary embodiment of the present invention.

FIG. 7(a) illustrates a method for transmitting control information when an ABS masks a CRC with a 16-bit STID according to an exemplary embodiment of the present invention, and FIG. 7(b) illustrates a method for receiving control information including a CRC masked by a 16-bit STID according to an exemplary embodiment of the present invention.

Referring to FIG. 7(a), the ABS generates a CRC using a cyclic generator polynomial and masks the CRC by a 16-bit STID including the masking indicator of 0b0011. Then the ABS transmits control information including the 16-bit MCRC to an AMS. The control information may be an A-MAP IE.

Referring to FIG. 7(b), upon receipt of the A-MAP IE, an AMS decodes the A-MAP IE and calculates a 16-bit MCRC using a cyclic generator polynomial. If the AMS did not perform a random access procedure and has a 16-bit STID, the AMS masks the 16-bit MCRC with the 16-bit STID including the masking indicator of 0b0011.

If the result of masking the MCRC with 16-bit STID is zero, the AMS reads the remaining fields of the A-MAP IE, determining that the A-MAP IE is for the AMS. On the contrary, if the result of masking the MCRC with the 16-bit STID is non-zero, the AMS ignores the A-MAP IE.

While it has been described in the above exemplary embodiments of the present invention that an STID identifies one AMS, an STID may be used to identify a plurality of AMSs. To be specific, in the case of broadcast information for a plurality of AMSs, a broadcasting allocation A-MAP IE for transmission of the broadcast information may be transmitted. An STID by which a CRC included in the broadcasting allocation A-MAP IE was masked identifies the plurality of AMSs and an MCRC may be generated for the broadcasting allocation A-MAP IE using the STID.

[Table 3] below illustrates definition of a masking indicator according to another exemplary embodiment of the present invention.

TABLE 3

| Masking indicator | Description |
| --- | --- |
| 0b0 | CRC is masked by STID |
| 0b1 | CRC is masked by RAID |

If the total length of a masking indicator and an STID or RAID is smaller than the length of a CRC (i.e. 16 bits), the resulting residual bits may be used for another usage. For example, if a 1-bit masking indicator and a 12-bit STID are used as illustrated in [Table 3], a CRC may be masked by the 1-bit masking indicator, 3 bits of all 0s, and the 12-bit STID. The 3 bits may indicate whether the STID identifies a particular AMS or a plurality of AMSs.

The masking indicator indicates an ID by which a CRC is masked. As illustrated in [Table 3], the masking indicator indicates whether a CRC is masked by an STID or RAID. A RAID may be created if an AMS transmits a ranging code or a bandwidth request code to an ABS. While in [Table 2], the masking indicator indicates whether a CRC is masked by a RAID created during ranging or by a RAID created during requesting a bandwidth, there is no distinction between a RAID for ranging and a RAID for bandwidth request in [Table 3].

In this exemplary embodiment, a process in case of ranging code transmission may be performed in the same manner as a process in case of requesting a bandwidth, except that an AMS transmits a ranging code or a bandwidth request code. Herein, the following description will be made of a case where an AMS transmits a ranging code.

A 12-bit RAID is assumed in the forgoing example described in relation to [Table 2]. The 12-bit RAID may be too short to ensure uniqueness in a random access between an AMS and an ABS. Therefore, a 15-bit RAID is assumed if a 1-bit CRC mask type indicator (i.e. a 1-bit mask indicator) is used as illustrated in [Table 3].

Upon receipt of a ranging code from an AMS, an ABS may allocate AMS-requested resources to the AMS by a CDMA allocation A-MAP IE. Specifically, the ABS may include a CRC masked by a RAID generated during ranging and a masking indicator of 0b1 in the CDMA allocation A-MAP IE and transmit the CDMA allocation A-MAP IE to the AMS.

The ABS may generate the CRC using a cyclic generator polynomial and mask the CRC by the RAID and the masking indicator of 0b1. Then the ABS may transmit the CDMA allocation A-MAP IE including the 16-bit MCRC to the AMS.

After decoding the CDMA allocation A-MAP IE, the AMS may calculate a 16-bit MCRC using a cyclic generator polynomial and mask the MCRC by a RAID generated during its ranging and the masking indicator of 0b1.

If the result of masking the MCRC by the RAID for and the masking indicator of 0b1 is zero, the AMS may read the remaining fields of the CDMA allocation A-MAP IE, determining that the CDMA allocation A-MAP IE is probably destined for the AMS. If the Type (e.g. Allocation Type) of the CDMA allocation A-MAP IE indicates ranging, the AMS determines that the ABS has transmitted the CDMA allocation A-MAP IE for the AMS. If the Type of the CDMA allocation A-MAP IE indicates any other type, for example, bandwidth request, the AMS may ignore the CDMA allocation A-MAP IE.

On the other hand, if the result of masking the MCRC by the RAID for and the masking indicator of 0b1 is non-zero, the AMS may ignore the CDMA allocation A-MAP IE.

According to the method described in [Table 3], the masking indicator does not specify whether a CRC is masked by a RAID generated during ranging o a RAID generated during requesting a bandwidth. Therefore, an additional field indicating a RAID for ranging or a RAID for bandwidth request should be transmitted.

[Table 4] below illustrates the format of a CDMA allocation A-MAP IE having an additional field indicating whether the CDMA allocation A-MAP IE is intended to allocate resources to an AMS that has attempted ranging or to an AMS that has requested a bandwidth.

TABLE 4

| Syntax | Size (bits) | Note |
| --- | --- | --- |
| CDMA_Allocation_A-MAP IE ( ) { | | |
| A-MAP IE Type | 4 | |

TABLE 4-continued

| Syntax | Size (bits) | Note |
| --- | --- | --- |
| Allocation Type | 1 | 0b0: ranging<br>0b1: bandwidth request |
| If Allocation Type=0b1{ | | |
| Resource assignment Information | 12 | Resource index (11 bits) specifies position and allocation size.<br>5 MHz: 2 first MSBs being 0s + 9 bits for resource index<br>10 MHz: 11 bits for resource allocation<br>20 MHz: 11 bits for resource allocation<br>Long TTI indicator(1 bit) indicates the number of AAI subframes spanned by the allocated resources.<br>0b0: 1 AAI subframe (default)<br>0b1: 4 UL AAI subframes for FDD, or all UL AAI subframes for TDD<br>If the number of DL AAI subframes, D is smaller than the number UL AAI subframes, U, long TTI indicator = 0b1 |
| HFA | 3 | HARQ feedback allocation |
| Power Level Adjust | 4 | Relative change in transmission power level. Signed integer in units of 1db |
| Reserved<br>} | TBD | |
| Else if Allocation Type=0b0 { | | |
| Resource assignment Information | 17 | Resource index (11 bits) specifies position and allocation size.<br>5 MHz: 2 first MSBs being 0s + 9 bits for resource index<br>10 MHz: 11 bits for resource allocation<br>20 MHz: 11 bits for resource allocation<br>Long TTI indicator (1 bit) indicates the number of AAI subframes spanned by the allocated resources.<br>0b0: 1 AAI subframe (default)<br>0b1: 4 UL AAI subframes for FDD, or all UL AAI subframes for TDD<br>If the number of DL AAI subframes, D is smaller than the number UL AAI subframes, U, long TTI indicator = 0b1<br>ISizeOffset (5 bits) is used to calculated burst size index |
| HFA | 3 | HARQ feedback allocation |
| Timing Adjust | 10 | Amount of advanced time required to adjust AMS transmission. Unsigned integer in units of 1/Fs |
| Power Level Adjust | 4 | Relative change in transmission power level. Signed integer in units of 1db |
| Offset Frequency Adjust | 6 | Relative change in transmission frequency. Signed integer in units of Hz |
| Reserved<br>} | TBD | |
| MCRC<br>} | 16 | CRC is masked by 1-bit masking indicator and RAID |

Figure 8:
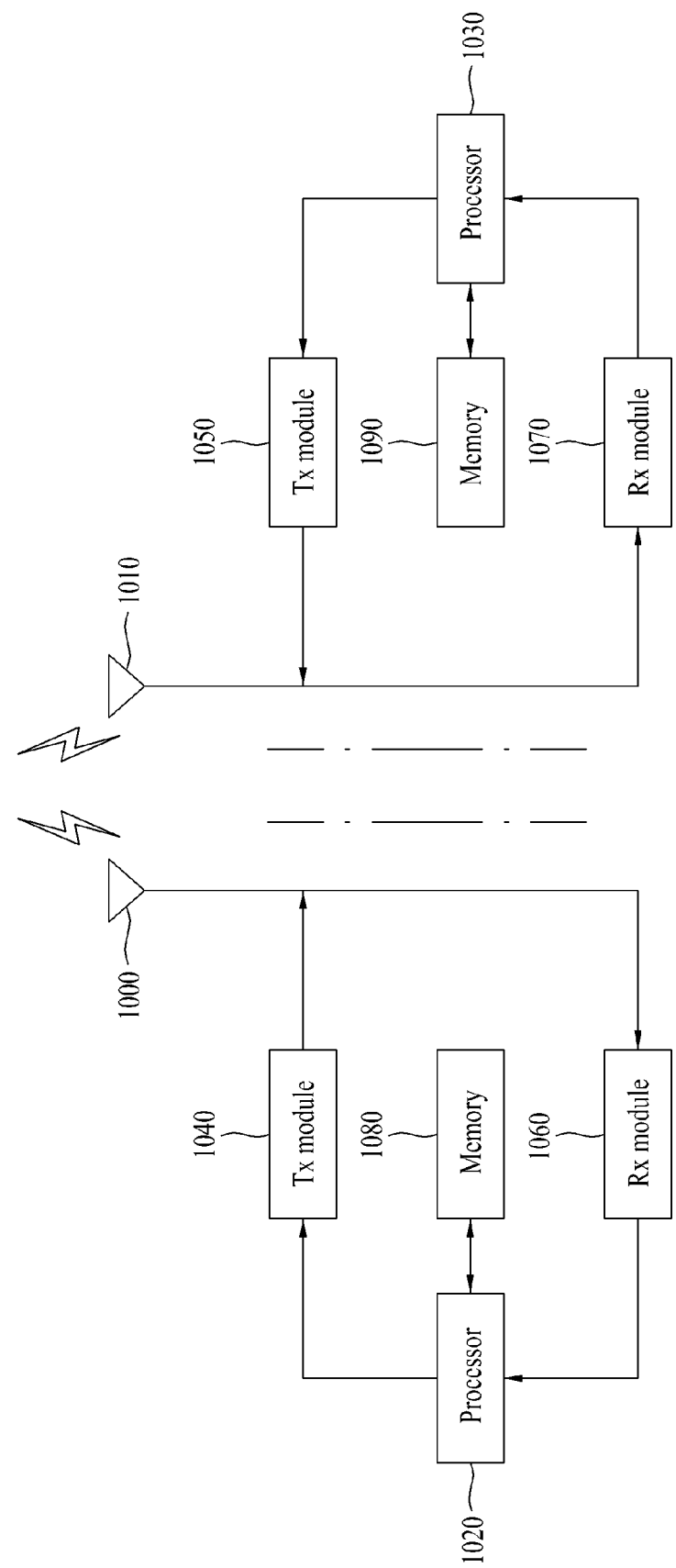
FIG. 8 is a block diagram of an AMS and an ABS for implementing the above exemplary embodiments of the present invention, according to an exemplary embodiment of the present invention.

FIG. 8 is a block diagram of an AMS and an ABS for implementing the above exemplary embodiments of the present invention, according to an exemplary embodiment of the present invention.

Referring to FIG. 8, the AMS and the ABS include antennas 1000 and 1010 for transmitting and receiving information, data, signals and/or messages, Transmission (Tx) modules 1040 and 1050 for transmitting messages by controlling the antennas 1000 and 1010, Reception (Rx) modules 1060 and 1070 for receiving messages by controlling the antennas 1000 and 1010, memories 1080 and 1090 for storing information related to communication with ABSs, and processors 1020 and 1030 for controlling the Tx modules 1040 and 1050, the Rx modules 1060 and 1070, and the memories 1080 and 1090.

The antennas 1000 and 1010 transmit signals generated from the Tx modules 1040 and 1050 over the air, or output external radio signals to the Rx modules 1060 and 1070. When Multiple Input Multiple Output (MIMO) is supported, two or more antennas may be used.

The processors 1020 and 1030 provide overall control to the AMS and the ABS. Especially, the processors 1020 and 1030 may perform a control function for implementing the exemplary embodiments of the present invention, for example, an operation for masking a CRC/MCRC by a masking indicator illustrated in [Table 2] or [Table 3]. Besides, the processors 1020 and 1030 may perform a variable Media Access Control (MAC) frame control function based on service characteristics and a propagation environment, a handover function, and an authentication and encryption function. Also the processors 1020 and 1030 each may further include an encryption module for controlling encryption of various messages and a timer module for controlling transmission and reception of various messages.

The Tx modules 1040 and 1050 may process transmission signals and/or data scheduled by the processors 1020 and 1030 in a predetermined coding and modulation scheme and output the processed transmission signals and/or data to the antennas 1000 and 1010.

The Rx modules 1060 and 1070 may recover original data by decoding and modulating radio signals received through the antennas 1000 and 1010 and thus may provide the original data to the processors 1020 and 1030.

The memories 1080 and 1090 may store programs for processing and control operations of the processors 1020 and 1030 and temporarily store input/output data. For example, the memory 1080 of the AMS may temporarily store a UL grant, system information, an STID, a Flow ID (FID), action time information, resource allocation information, and frame offset information, which are received from the ABS.

Each of the memories 1080 and 1090 may include at least one of a flash memory-type storage medium, a hard disc-type storage medium, a multimedia card micro-type storage medium, a card-type memory (e.g. an Secure Digital (SD) or extreme Digital (XS) memory), a Random Access Memory (RAM), a Read-Only Memory (ROM), an Electrically Erasable Programmable Read-Only Memory, a Programmable Read-Only Memory, a magnetic memory, a magnetic disc, and an optical disk.

In the afore-described methods, an AMS determines whether a received A-MAP IE is for the AMS by masking an MCRC calculated using a cyclic generator polynomial by its STID and a masking indicator or a RAID and a masking indicator and checking whether the result of the masking is zero or non-zero. It may be further contemplated that the AMS determines whether the received A-MAP IE is for the AMS by determining whether the calculated MCRC is identical to its STID and a masking indicator, or a RAID and a masking indicator. According to different methods, an AMS may determine whether a received A-MAP IE is for the AMS depending on how its manufacturer configures the AMS.

As is apparent from the above description,

The exemplary embodiments of the present invention may be achieved by various means, for example, hardware, firmware, software, or a combination thereof. In a hardware configuration, the methods for transmitting control information in a wireless communication system according to the exemplary embodiments of the present invention may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the methods for updating a location in a wireless communication system according to the embodiments of the present invention may be implemented in the form of a module, a procedure, a function, etc. performing the above-described functions or operations. A software code may be stored in a memory unit and executed by a processor. The memory unit is located at the interior or exterior of the processor and may transmit and receive data to and from the processor via various known means.

Those skilled in the art will appreciate that the present invention may be embodied in other specific forms than those set forth herein without departing from the spirit and essential characteristics of the present invention. The above description is therefore to be construed in all aspects as illustrative and not restrictive. The scope of the invention should be determined by reasonable interpretation of the appended claims and all changes coming within the equivalency range of the invention are intended to be embraced in the scope of the invention.

It is obvious to those skilled in the art that claims that are not explicitly cited in each other in the appended claims may be presented in combination as an exemplary embodiment of the present invention or included as a new claim by a subsequent amendment after the application is filed.

What is claimed is:

1. A method for transmitting control information at a Base Station (BS) in a wireless communication system, the method comprising:
    masking a Cyclic Redundancy Check (CRC) by a CRC mask including a bit stream of a predetermined length and an indicator indicating the bit stream; and
    transmitting control information including the masked CRC to at least one Mobile Station (MS),
    wherein the indicator indicates whether the bit stream included in the CRC mask includes a Random Access IDentifier (RAID).

2. The method according to claim 1, wherein if the bit stream does not include the RAID, the bit stream includes a Station ID (STID).

3. The method according to claim 2, wherein the STID identifies one MS or a plurality of MSs.

4. The method according to claim 1, wherein the bit stream further includes one or more additional bits.

5. The method according to claim 4, wherein the one or more additional bits are used to indicate whether the control information is for a plurality of MSs.

6. The method according to claim 1, wherein the control information is a Code Division Multiple Access allocation Advanced-MAP Information Element (CDMA allocation A-MAP IE).

7. The method according to claim 1, further comprising receiving a ranging request from the at least one MS,
    wherein the bit stream includes the RAID, and
    wherein the control information allocates resources that the at least one MS requested by the ranging request.

8. The method according to claim 7, wherein the RAID is generated according to index of time in which a ranging code is transmitted and an index of the ranging code.

9. The method according to claim 1, further comprising receiving a bandwidth request from the at least one MS,
wherein the bit stream includes the RAID, and
wherein the control information allocates resources that the at least one MS requested by the bandwidth request.

10. The method according to claim 9, wherein the RAID is generated according to index of time in which a bandwidth request code is transmitted and an index of the bandwidth request code.

11. A method for receiving control information at a Mobile Station (MS) in a wireless communication system, the method comprising:
receiving from a Base Station (BS) control information including a Cyclic Redundancy Check (CRC) masked by a CRC mask including a bit stream of a predetermined length and an indicator indicating the bit stream; and
decoding the control information and checking the masked CRC,
wherein the indicator indicates whether the bit stream included in the CRC mask includes a Random Access IDentifier (RAID).

12. The method according to claim 11, wherein if the bit stream does not include the RAID, the bit stream includes a Station ID (STID).

13. The method according to claim 12, wherein the STID identifies one MS or a plurality of MSs.

14. The method according to claim 11, wherein the bit stream further includes one or more additional bits.

15. The method according to claim 14, wherein the one or more additional bits are used to indicate whether the control information is for a plurality of MSs.

16. The method according to claim 11, wherein the control information is a Code Division Multiple Access allocation Advanced-MAP Information Element (CDMA allocation A-MAP IE).

17. A Base Station (BS) for transmitting control information in a wireless communication system, the BS comprising:
a processor;
a reception module;
a transmission module; and
an antenna for transmitting a radio signal received over the air to the reception module and transmitting a radio signal received from the transmission module over the air,
wherein the processor controls a Cyclic Redundancy Check (CRC) to be masked by a CRC mask including a bit stream of a predetermined length and an indicator identifying the bit stream and controls control information including the masked CRC to be transmitted to at least one Mobile Station (MS) through the transmission module, and
wherein the indicator indicates whether the bit stream included in the CRC mask includes a Random Access IDentifier (RAID).

18. A Mobile Station (MS) for receiving control information in a wireless communication system, the MS comprising:
a processor;
a reception module;
a transmission module; and
an antenna for transmitting a radio signal received over the air to the reception module and transmitting a radio signal received from the transmission module over the air,
wherein the processor controls control information including a Cyclic Redundancy Check (CRC) masked by a CRC mask including a bit stream of a predetermined length and an indicator indicating the bit stream to be received from a Base Station (BS) and to be decoded and controls the masked CRC to be checked,
wherein the indicator indicates whether the bit stream included in the CRC mask includes a Random Access IDentifier (RAID).

* * * * *